(12) United States Patent
Chuang et al.

(10) Patent No.: US 8,890,260 B2
(45) Date of Patent: Nov. 18, 2014

(54) POLYSILICON DESIGN FOR REPLACEMENT GATE TECHNOLOGY

(75) Inventors: Harry Hak-Lay Chuang, Hsinchu (TW); Kong-Beng Thei, Pao-Shan Village (TW); Sheng-Chen Chung, Jhubei (TW); Chiung-Han Yeh, Tainan (TW); Lee-Wee Teo, Singapore (SG); Yu-Ying Hsu, Pingzhen (TW); Bao-Ru Young, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 660 days.

(21) Appl. No.: 12/554,604

(22) Filed: Sep. 4, 2009

(65) Prior Publication Data
US 2011/0057267 A1 Mar. 10, 2011

(51) Int. Cl.
*H01L 29/78* (2006.01)
*H01L 27/06* (2006.01)
*H01L 27/092* (2006.01)
*H01L 29/66* (2006.01)
*H01L 21/8238* (2006.01)
*H01L 49/02* (2006.01)

(52) U.S. Cl.
CPC .... *H01L 21/823842* (2013.01); *H01L 27/0629* (2013.01); *H01L 27/0922* (2013.01); *H01L 29/66545* (2013.01); *H01L 29/7833* (2013.01); *H01L 29/6659* (2013.01); *H01L 28/20* (2013.01)
USPC .................... 257/379; 257/538; 257/E23.149

(58) Field of Classification Search
CPC ........................... H01L 27/0629; H01L 28/20
USPC ........... 257/280, 538, E23.149, 380, 371, 379
See application file for complete search history.

(56) References Cited

U.S. PATENT DOCUMENTS

| 5,465,005 A * | 11/1995 | Eklund et al. ................. 257/538 |
| 6,316,816 B1 * | 11/2001 | Matsumoto .................... 257/538 |
| 7,659,168 B2 * | 2/2010 | Hsu et al. ....................... 438/281 |
| 7,847,370 B2 * | 12/2010 | Kitajima ........................ 257/529 |
| 8,193,050 B2 * | 6/2012 | Yu et al. ......................... 438/199 |
| 2005/0189613 A1 * | 9/2005 | Otsuka et al. ................. 257/529 |
| 2007/0096183 A1 * | 5/2007 | Ogawa et al. ................. 257/300 |
| 2007/0117327 A1 * | 5/2007 | Lee et al. ....................... 438/266 |
| 2009/0090977 A1 * | 4/2009 | Freeman et al. .............. 257/379 |
| 2010/0328022 A1 * | 12/2010 | Fan et al. ....................... 338/309 |

* cited by examiner

*Primary Examiner* — Jerome Jackson, Jr.
*Assistant Examiner* — Paul Budd
(74) *Attorney, Agent, or Firm* — Haynes and Boone, LLP

(57) ABSTRACT

The present disclosure provides an integrated circuit. The integrated circuit includes a semiconductor substrate; and a passive polysilicon device disposed over the semiconductor substrate. The passive polysilicon device further includes a polysilicon feature; and a plurality of electrodes embedded in the polysilicon feature.

21 Claims, 16 Drawing Sheets

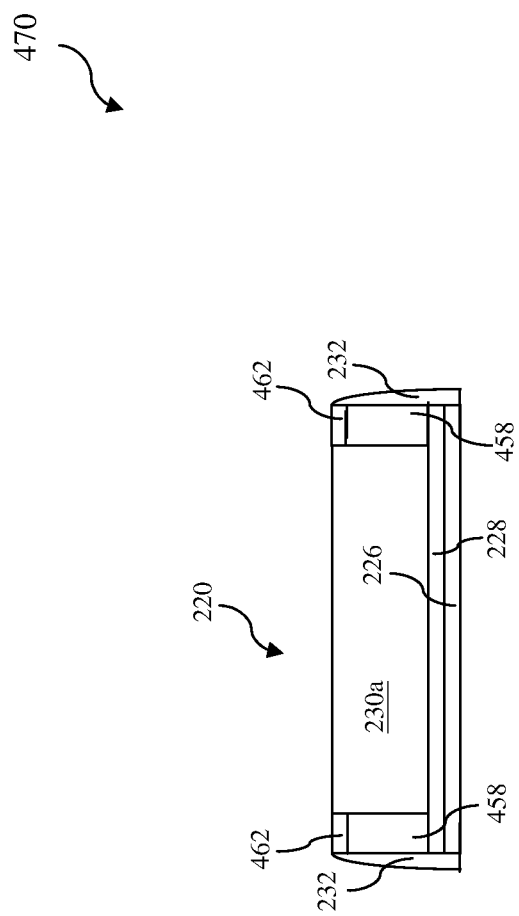

POLYSILICON DESIGN FOR REPLACEMENT GATE TECHNOLOGY

BACKGROUND

Precise polysilicon resistor has been used in conventional integrated circuit (IC) design. When a semiconductor device such as a metal-oxide-semiconductor field-effect transistor (MOSFET) is scaled down through various technology nodes, a high k dielectric material and metal are adopted to form a gate stack. For gate replacement process, the resistance of the formed polysilicon resistors is too low. A single crystalline silicon resistor has been proposed to resolve the issue. However, the single crystalline silicon resistor cannot provide precise impedance matching for the applications, such as analog, radio frequency (RF) and mixed-mode circuits.

SUMMARY

The present disclosure provides an integrated circuit. The integrated circuit includes a semiconductor substrate; and a passive polysilicon device disposed over the semiconductor substrate. The passive polysilicon device further includes a polysilicon feature; and a plurality of electrodes embedded in the polysilicon feature.

The present disclosure also provides another embodiment of a method of making an integrated circuit. The method includes forming a high k dielectric material layer on a semiconductor substrate; forming a polysilicon layer on the high k dielectric material layer; patterning the polysilicon layer to form a polysilicon feature for a passive device; forming a plurality of electrodes embedded in the polysilicon feature.

The present disclosure also provides another embodiment of a method of making an integrated circuit. The method includes forming a high k dielectric material layer on a semiconductor substrate; forming a polysilicon layer on the high k dielectric material layer; patterning the polysilicon layer to form a first dummy gate for a first field-effect transistor (FET), a second dummy gate for a second FET, and a polysilicon feature for a passive device; forming an inter-level dielectric (ILD) layer on the semiconductor substrate; performing a first chemical mechanical polishing (CMP) process to etch back the ILD layer; removing a portion of the polysilicon feature from the passive device and the first dummy gate from the first FET, resulting in a plurality of column trenches in the passive device and a first gate trench in the first FET; forming a first metal layer in the column trenches and the first gate trench, wherein the first metal layer has a first work function; forming a first conductive layer on the first metal layer; and performing a second CMP process to remove excessive portion of the first metal layer and the first conductive layer above a top surface of the ILD layer.

The present disclosure also provides another embodiment of a method of making an integrated circuit. The method includes forming a high k dielectric material layer on a semiconductor substrate; forming a polysilicon layer on the high k dielectric material layer; patterning the polysilicon layer to form a first gate for a first field-effect transistor (FET), a second gate for a second FET, and a polysilicon feature for a passive device; forming, on the semiconductor substrate, a patterned mask having a first set of openings defining contact regions on the polysilicon feature of the passive device, and a second set of openings defining source/drain regions in the first FET; and applying a first ion implantation to the semiconductor substrate to form electrodes embedded in the polysilicon feature within the first set of openings; and source and drain of the first FET within the second set of openings.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 15-16 are sectional views of the polysilicon structure of FIG. 14 in various embodiments constructed according to various aspects of the present disclosure.

DETAILED DESCRIPTION

Figure 1:
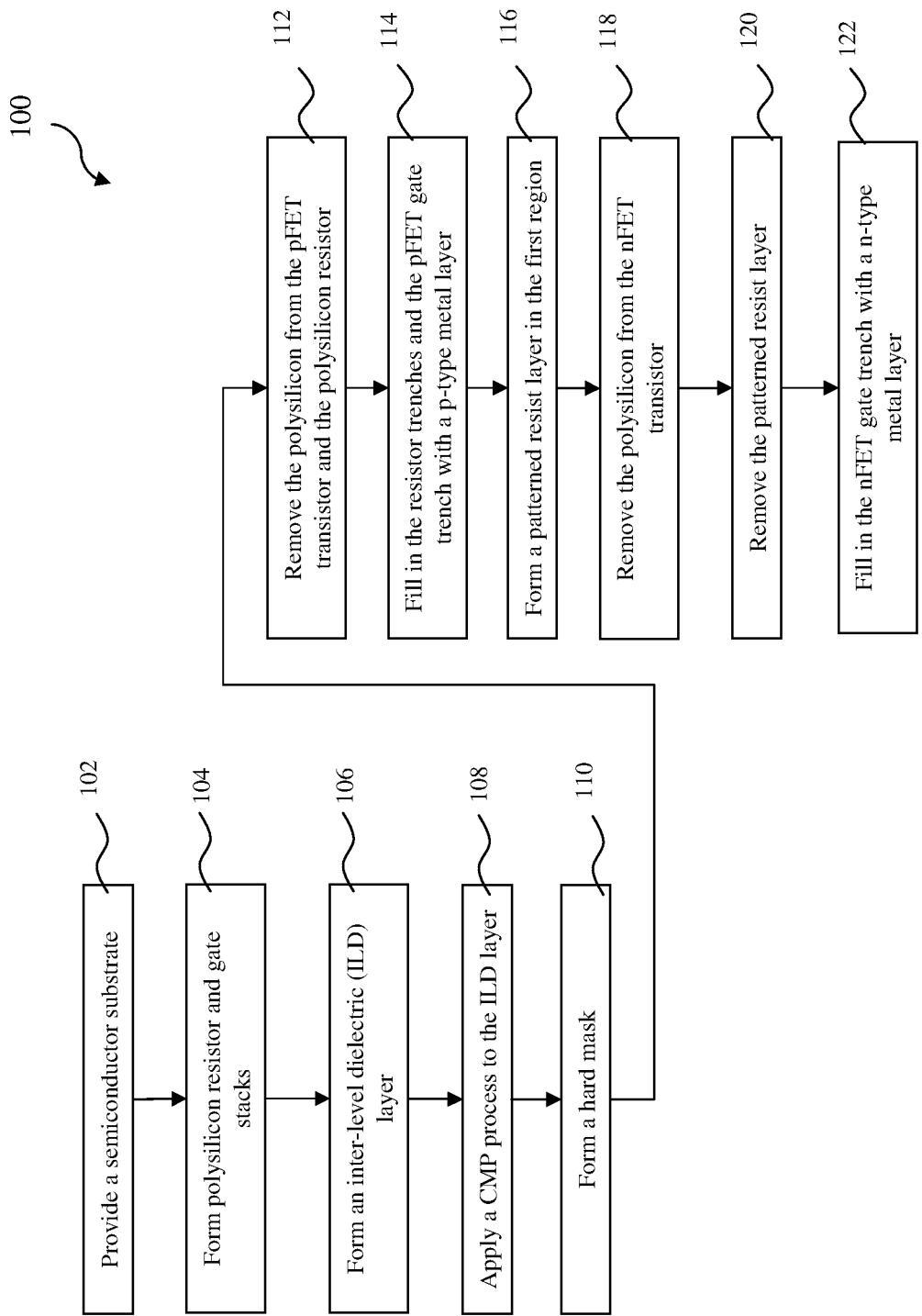
FIG. 1 is a flowchart of a method making a semiconductor device having metal gate stacks and polysilicon structures constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of an embodiment of a method 100 making a semiconductor device having a metal gate stack constructed according to various aspects of the present disclosure. FIGS. 2 through 11 are sectional views of a semiconductor structure 200 at various fabrication stages and constructed according to one or more embodiments. The semiconductor structure 200 and the method 100 of making the same are collectively described with reference to FIGS. 1 through 11.

The method 100 begins at step 102 by providing a semiconductor substrate 210. The semiconductor substrate 210 includes silicon. Alternatively, the substrate includes germanium, silicon germanium or other proper semiconductor materials. The semiconductor substrate 210 also includes various isolation features such as shallow trench isolation (STI) formed in the substrate to separate various devices. The semiconductor substrate also includes various doped regions such as n-well and p-wells. In one embodiment, the semiconductor substrate 210 includes a first region 212 and a second region 214. The first region 212 includes a trench isolation feature 216 and the second region 214 includes another trench isolation feature 217. The formation of the STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure. In another embodiment, the semiconductor substrate 210 in the second region 214 includes a p-well 218 and an n-well 219.

The method 100 proceeds to step 104 by forming a polysilicon resistor stack (or resistor stack) 220 in the first region 212 and gate stacks 222/224 in the second region 214. The resistor stack 220 and the gate stacks 222/224 are formed in a same processing procedure. The resistor stack 220 includes a high-k (high dielectric constant) dielectric layer 226 formed on the STI feature 216. The high-k dielectric layer 226 includes a dielectric material having the dielectric constant higher than that of thermal silicon oxide, about 3.9. In one example, the high-k dielectric layer 226 includes hafnium oxide (HfO). In various examples, the high-k dielectric layer 226 includes metal oxide, metal nitride, or combinations thereof. In one example, the high-k dielectric layer 226 includes a thickness ranging between about 10 angstrom and about 20 angstrom. In one embodiment, the resistor stack 220 further includes a conductive layer 228 disposed on the high-k dielectric layer 226. In one example, the conductive layer 228 includes titanium nitride (TiN). In another example, the thickness of the titanium nitride layer ranges between about 10 angstrom and about 30 angstrom.

The polysilicon resistor stack 220 further includes a polysilicon layer 230 disposed on the conductive layer 228. The polysilicon layer is non-doped to have a higher resistance or doped to have a proper resistance. In one example, the polysilicon is doped to have a resistance higher than about 500 Ohm per square. Similarly, the gate stacks 222/224 also include the high k dielectric layer 226 disposed on the substrate 210 in the second region 214. In one embodiment, the gate stacks 222/224 also include the conductive layer 228 disposed on the high-k dielectric layer 226. The gate stacks 222 and 224 also include the polysilicon layer 230 disposed on the conductive layer 228. For clarity, the portions of the polysilicon layer 230 in the resistor stack 220 and the gate stacks 222/224 are referred to as 230a, 230b and 230c, respectively. In one embodiment, spacers 232 are disposed on the sidewalls of the polysilicon resistor stack 220 and the sidewalls of the gate stacks 222/224. Alternatively, an interfacial layer (IL), such as silicon oxide, may be interposed between the high-k dielectric layer 226 and the substrate 210. Particularly, the interfacial layer is interposed between the STI feature 216 and the high-k dielectric layer 226 in the first region 212 and is interposed between the substrate 210 and the high-k dielectric layer 226 in the second region.

In one embodiment, the resistor stack 220 is formed for a passive device. This passive device can be used for a resistor or alternatively used as a polysilicon fuse. In another embodiment, the first gate stack 222 is formed in the second region 214 for an n-type field-effect transistor (nFET) 234 and the second gate stack 224 is formed in the second region for a p-type field-effect transistor (pFET) 236. In one embodiment, the nFET 234 is formed in the p-well 218. In another embodiment, the pFET 236 is formed in the n-well 219. The nFET 234 further includes various doped regions, such as source/drain 238. Similarly, the pFET 236 further includes various doped regions, such as source/drain 240. In one embodiment, the nFET and pFET include metal-oxide-semiconductor FETs (MOSFET) such as nMOSFET and pMOSFET.

In one embodiment of the forming the resistor stack 220 and the gate stacks 222/224, various material layers, including the high-k dielectric layer 226, the conductive layer 228 and the polysilicon layer 230, are formed on the substrate 210 by various deposition technique. Then a lithography patterning process is applied to the various material layers to pattern thereof, forming the resistor stack 220 and the gate stacks 222/224.

Then source and drain 238 are formed for the nFET 234 by a proper technique, such as ion implantation. Similarly, source and drain 240 are formed for the pFET 236 by a similar technique. In one embodiment of, the source and drain features (238 and 240) further include light doped source/drain (LDD) features aligned with the associated gate stack and heavily doped source/drain (S/D) features aligned with the associated sidewall spacer 232. In furtherance of the embodiment, taking nFET 234 as an example, the LDD features are formed first by ion implantation with a light doping dose. Thereafter, the spacer 232 is formed by dielectric deposition and plasma etching. Then the heavily doped S/D features are formed by ion implantation with a heavy doping dose. The various source and drain features of the pFET 236 can be formed in a similar procedure but with opposite doping type. The sidewall spacer can be formed in the polysilicon resistor 220 in the process to form the spacers of nFET 234 and the pFET 236.

Figure 2:
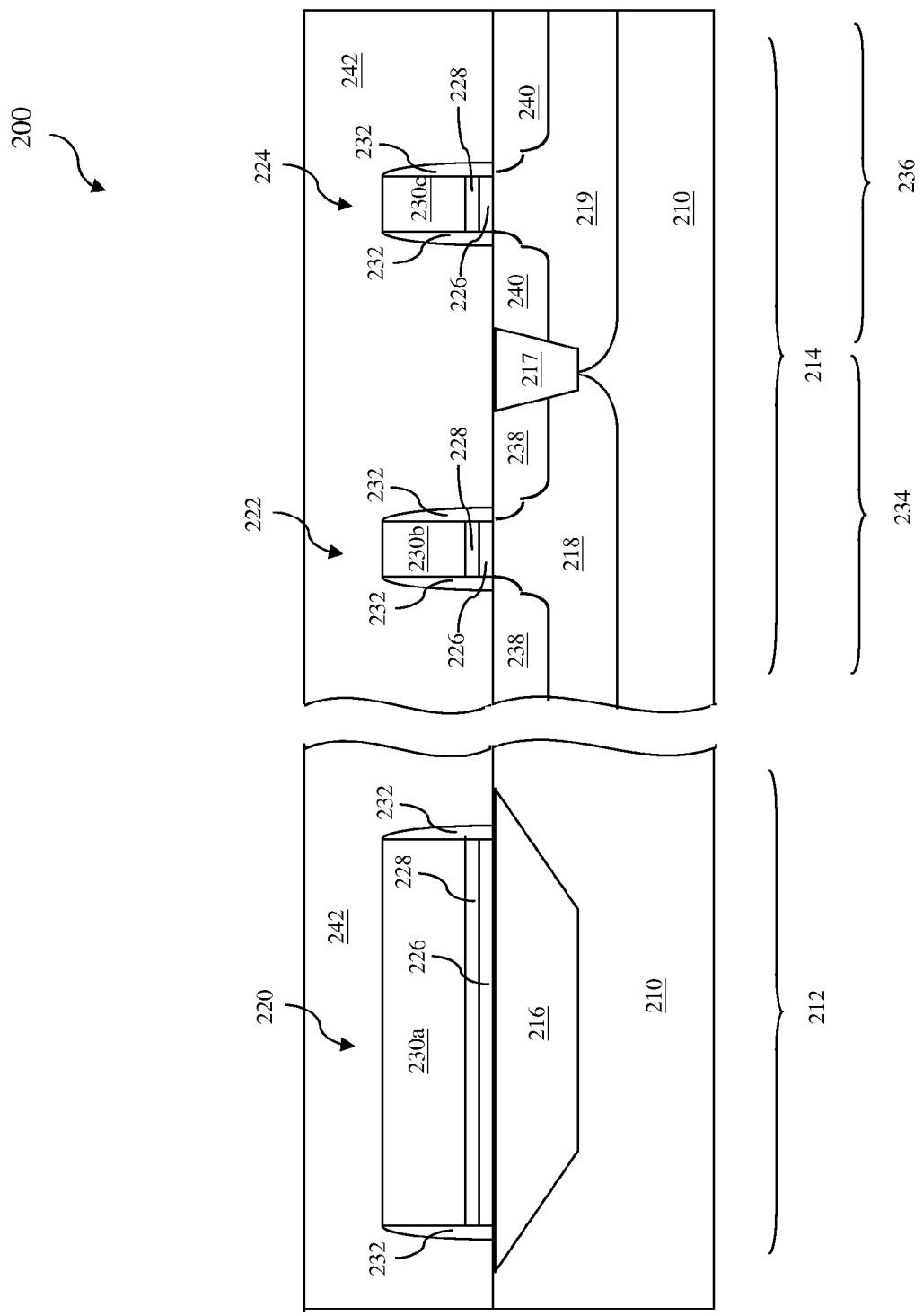
FIGS. 2-6 and 8-11 are sectional views of one embodiment of a semiconductor structure having metal gate stacks and polysilicon structure at various fabrication stages constructed according to various aspects of the present disclosure.

Still referring to FIG. 2, the method 100 proceeds to step 106 by forming an inter-level dielectric (ILD) layer 242 (also referred to as ILD0) on the semiconductor substrate 210, the resistor stack 220 and the gate stacks 222/224. The ILD layer 242 is formed by a suitable technique, such as chemical vapor deposition (CVD). For example, a high density plasma CVD can be implemented to form the ILD layer 242. The ILD layer 242 is formed on the substrate to a level above the top surface of the resistor stack 220 and the gate stacks 222/224 such that the resistor stack 220 and the gate stacks 222/224 are embedded in.

Figure 3:
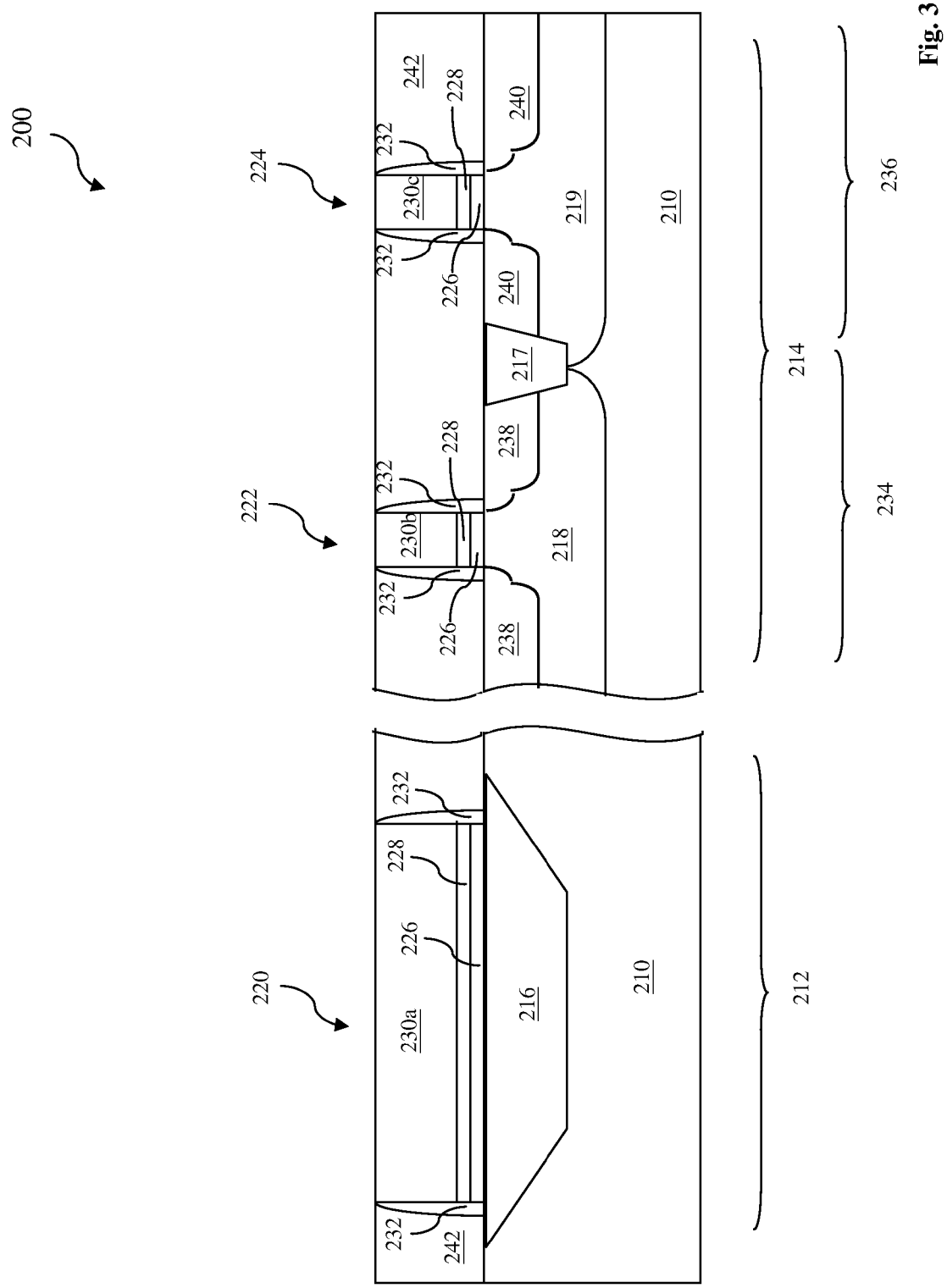

Referring to FIG. 3, the method 100 proceeds to step 108 by applying a chemical mechanical polishing (CMP) process to the ILD layer 242 to reduce the thickness of the ILD layer 242 such that the resistor stack 220 and the gate stacks 222/242 are exposed from the top side. The processing conditions and parameters of the CMP process, including slurry chemical and polishing pressure, can be tuned to partially remove and planarize the ILD layer 242.

Figure 4:
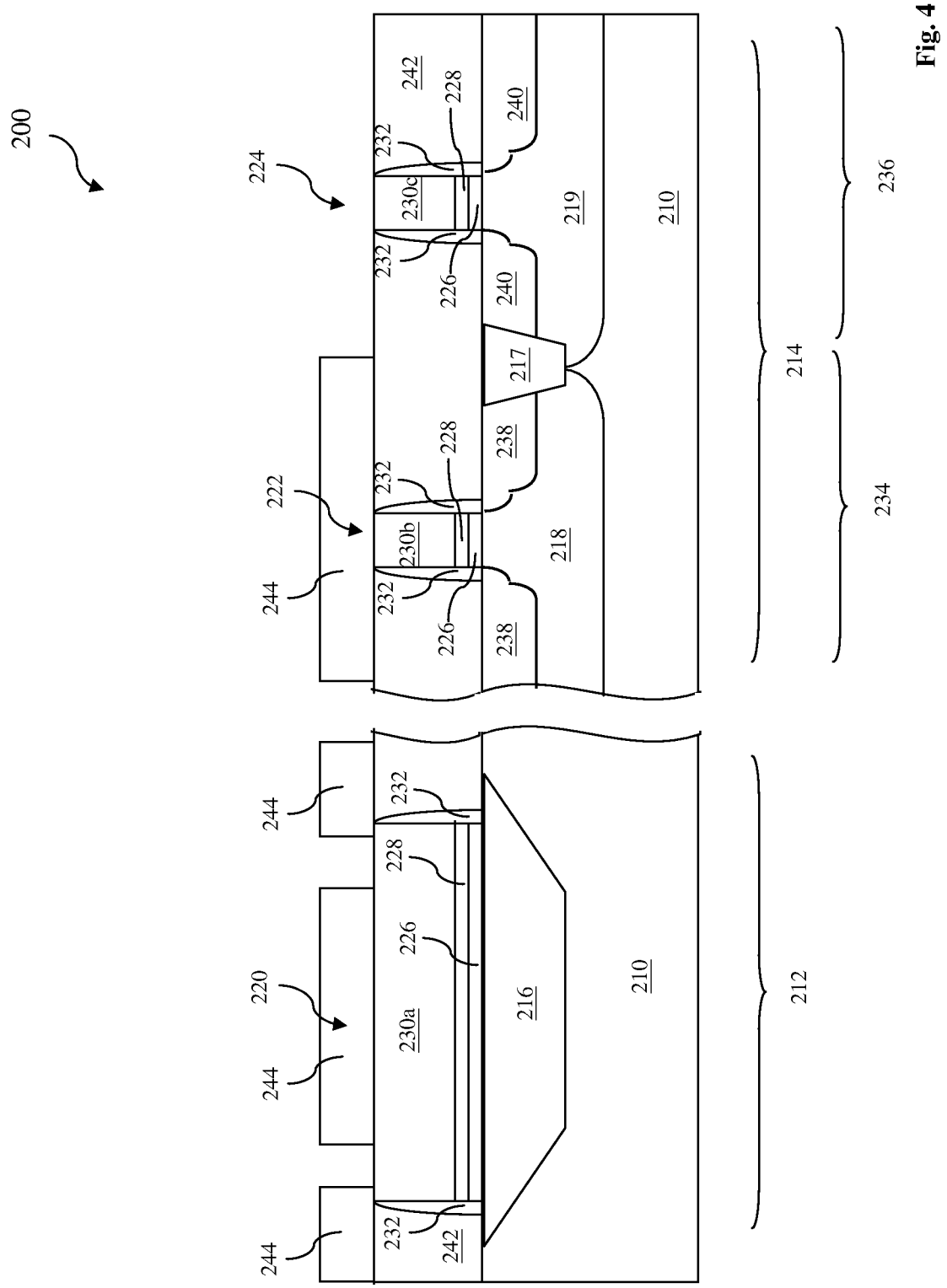

Referring to FIG. 4, the method 100 proceeds to step 110 by forming a hard mask layer 244 on the semiconductor structure 200. The hard mask layer 244 includes various openings and is used for the subsequent etching process. In one embodiment, the hard mask layer 244 includes openings, as illustrated in FIG. 4, to expose the gate stack 224 and partially expose the resistor stack 220. The formation of the hard mask layer 244 includes deposition and etching. In one example, the hard mask layer 244 includes silicon oxide formed by a CVD, such as plasma enhanced CVD (PECVD). The hard mask layer 244 may include other suitable material such as titanium nitride (TiN) or silicon nitride in various embodiments. In one example, the TiN hard mask layer can be formed by a physical vapor deposition (PVD). In another example, the silicon nitride hard mask layer can be formed by a suitable technique, such as PECVD. In one example, the thickness of the hard mask layer 244 ranges between about 50 angstrom and about 200 angstrom. In another example, the hard mask layer 244 includes a thickness of about 80 angstrom.

Figure 5:
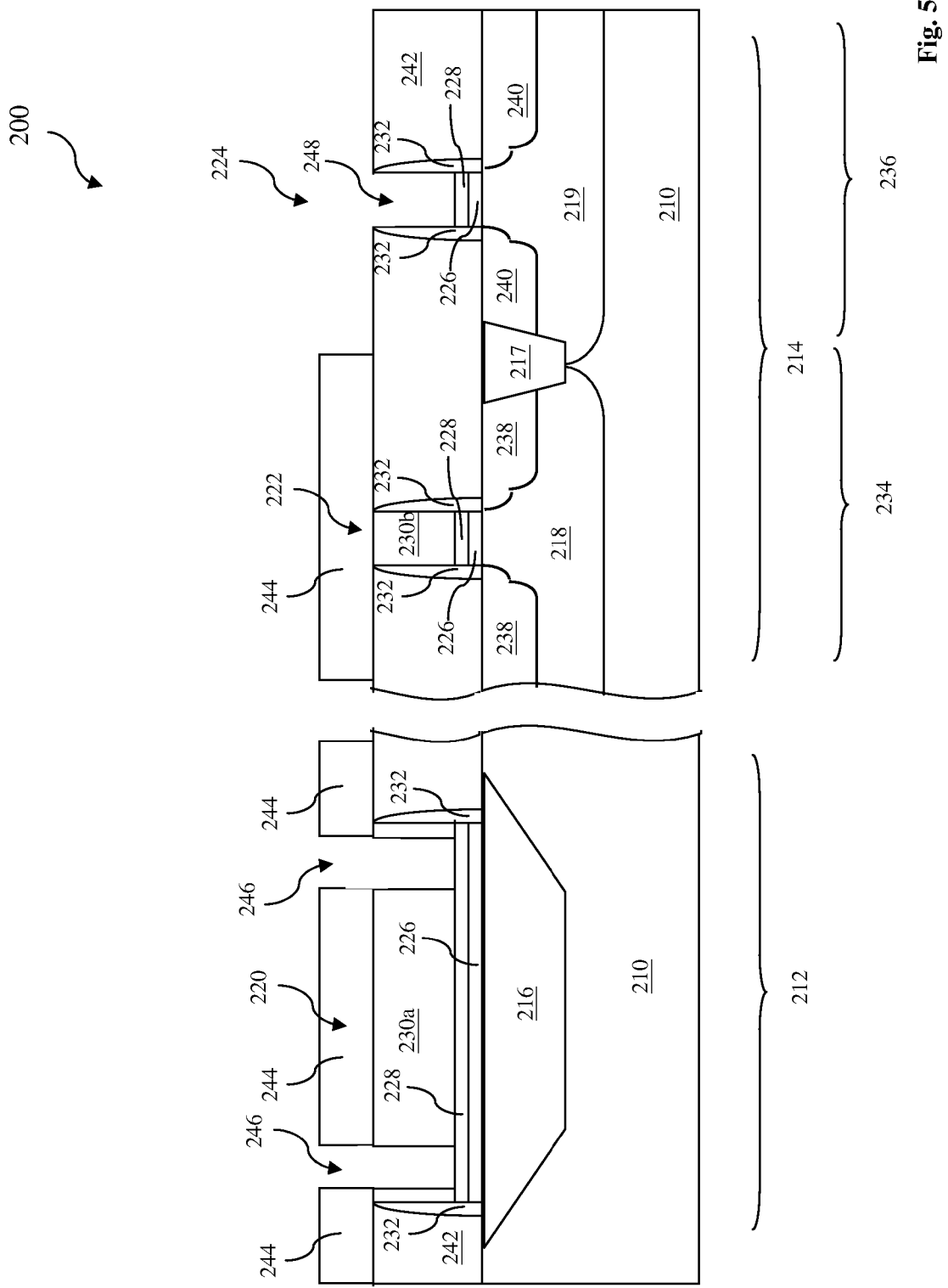

Referring to FIG. 5, the method 100 proceeds to step 112 by removing the polysilicon within the openings of the hard mask layer 244 using an etching process, forming resistor trenches 246 and gate trench 248. The other regions underlying the hard mask layer 244 are substantially protected from being removed during the etching process. The etching process used to remove the polysilicon within the openings of the hard mask layer 244 may implement suitable dry etching, wet etching or combinations thereof. In one example, an etching solution including HNO3, H2O and HF may be used to remove polysilicon. In another example, chlorine (Cl)-based plasma may be used to selectively remove the polysilicon layer.

Figure 6:
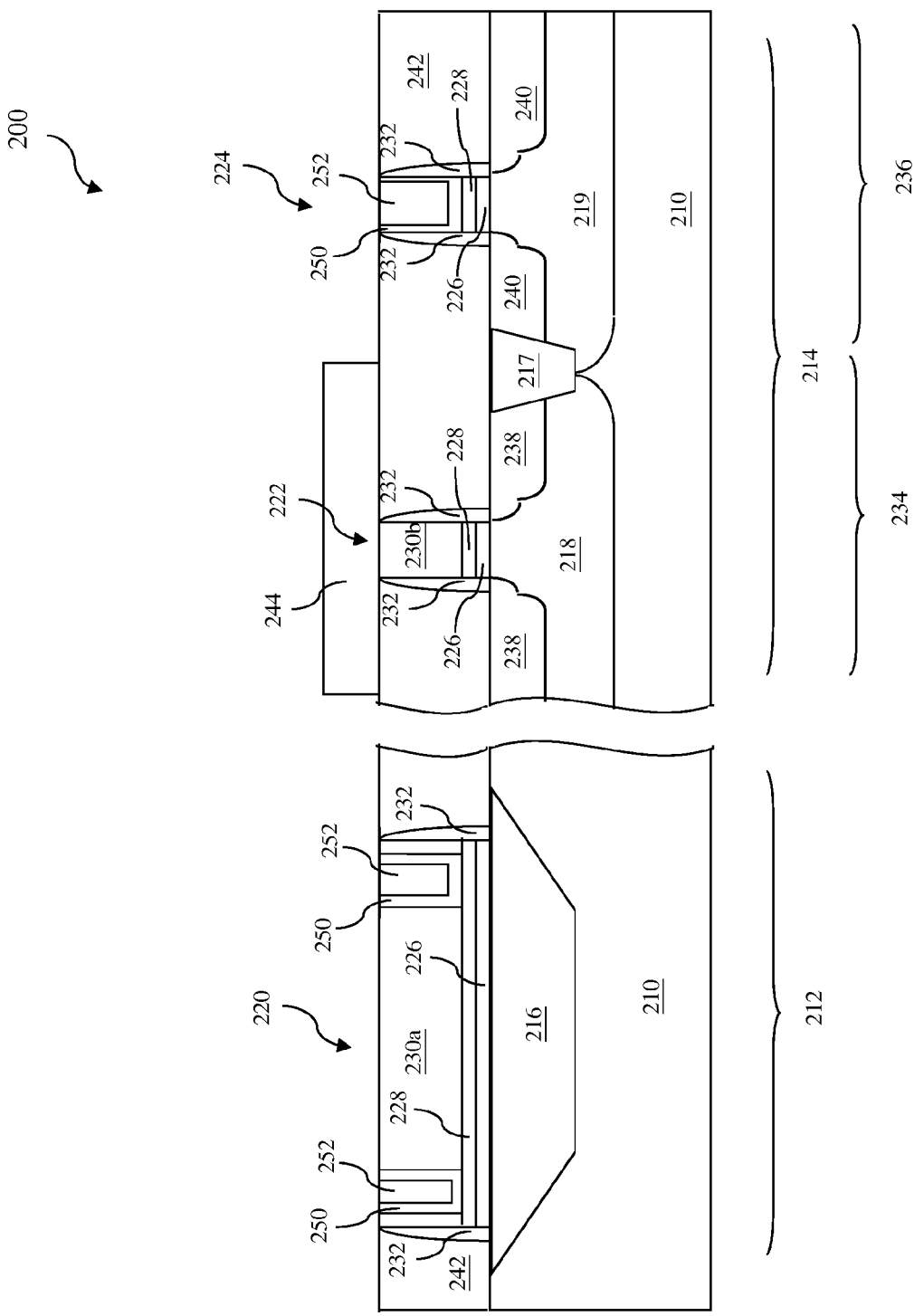

Referring to FIG. 6, the method 100 proceeds to step 114 by filling the gate trench 248 and the resistor trenches 246 with p-metal 250 and a conductive material 252, forming a gate electrode for the pFET 236 and various electrode features for the resistor stack 220. The polysilicon resistor stack and the electrodes embedded therein constitutes the passive polysilicon device (or passive device) that can be used as a resistor or a fuse. The passive device is further separately illustrated in FIG. 7 as a top view and is labeled as 253. The passive device 253 includes polysilicon feature 230a and the various electrodes 254. The electrodes 254 are formed in the resistor trenches. In the present embodiment, the electrode 254 includes the p-metal layer 250 and the conductive material layer 252. The p-metal includes a metal-based conductive material having a work function compatible to the pFET 236. For one example, the p-metal has a work function of about or greater than about 5.2 eV. In one embodiment, the p-metal includes titanium nitride (TiN) or tantalum nitride (TaN). In other embodiments, the p-metal include TiN, TaN, tungsten nitride (WN), titanium aluminum (TiAl), or combinations thereof. The p-metal 250 may include various metal-based film as a stack for optimized device performance and processing compatibility. The p-metal layer can be formed by a suitable process, such as PVD. The conductive material 252 is thereafter substantially fills in the gate trench 248 and the resistor trenches 246, as illustrated in FIG. 6. The conductive material 252 includes tungsten or aluminum according to various embodiments. The method to form the conductive material may include CVD or PVD. Additionally, another CMP process may be applied to remove the excessive p-metal and the conductive material above the trenches 246/248 and on the ILD layer 242.

The hard mask layer 244 in the first region 212 may be thereafter removed using a procedure, such as a lithography process and an etching process according to one embodiment. Thus, formed passive device 253 includes various metal electrodes embedded in the polysilicon feature 230a constructed according to various aspects of the one embodiment. The passive polysilicon device 253 includes the polysilicon feature 230a disposed on the substrate, with a geometry as a rectangle in this particular example. The passive device 253 further includes various conductive columns 254 as the electrodes properly configured and embedded in the polysilicon feature 230a. The conductive columns 254 include the p-metal layer 250 and the conductive material layer 252. In one embodiment, an electric voltage is applicable between a first subset of the conductive columns and a second subset of the conductive columns such that an electric current can flow in the polysilicon feature 230a from the first subset of the conductive columns to the second subset of the conductive columns. In this particular example, the electric voltage is applied between the left two and right two of the conductive columns 254. The electric current flows from the left two to the right two of the conductive columns 254. According to the disclosed structure and the method of making the passive device 253, the method is compatible to the method to form a transistor (such as nFET 234 or pFET 236) with a gate stack having high k dielectric and metal electrode, therefore the fabrication cost is reduced. Furthermore, the resistance of the polysilicon resistor can also be properly controlled and precisely defined.

Figure 8:
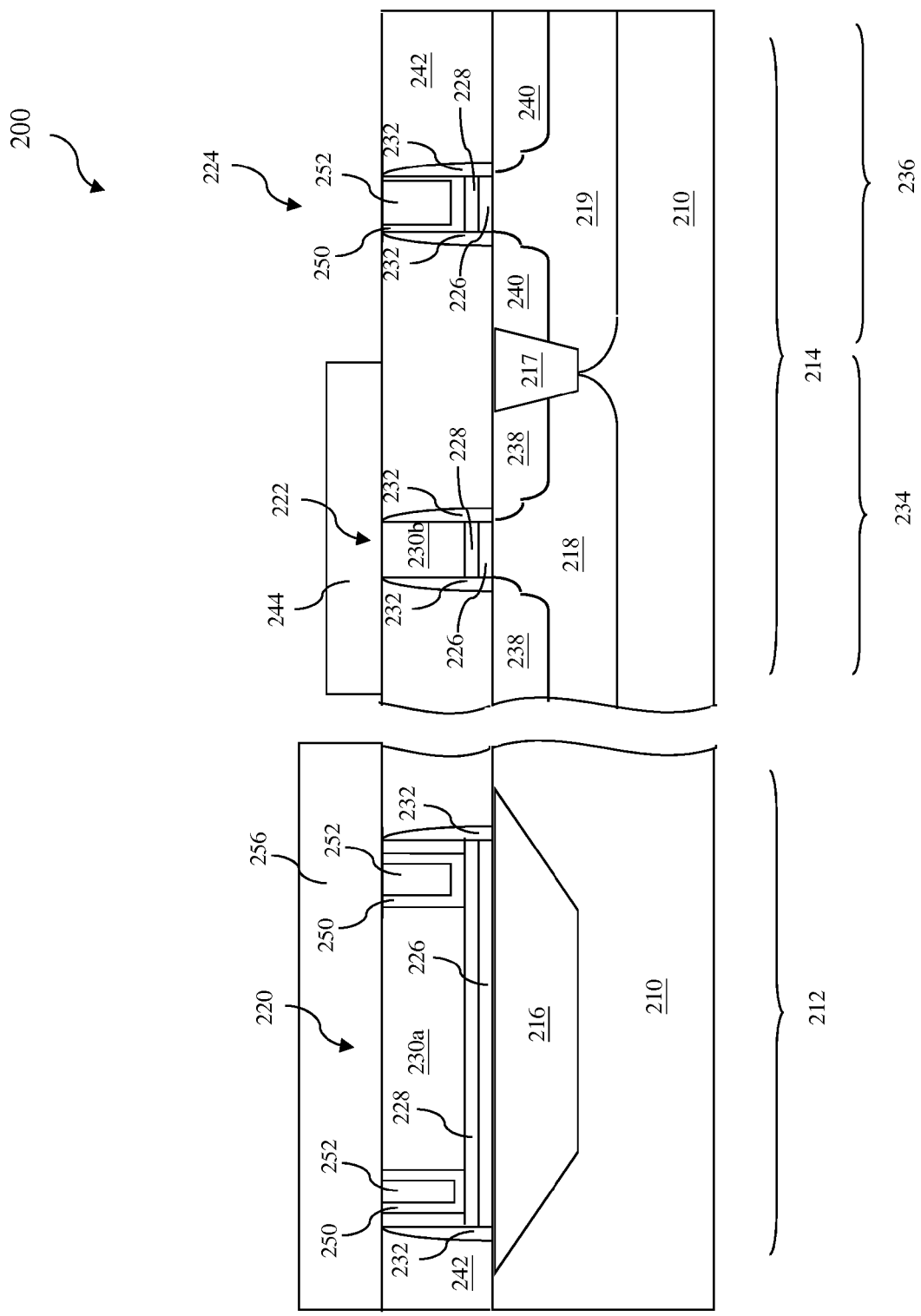

Referring to FIG. 8, the method 100 proceeds to step 116 by forming a patterned photoresist layer 256 to cover the passive device (including resistor stack 220 and the embedded electrodes) in the first region 212. Therefore the formed passive device is protected from subsequent etching process. The patterned photoresist layer 256 can be formed by a lithography process known in the art. For example, the lithography process may include spin-on coating, baking, exposure, post-exposure baking and developing.

Figure 9:
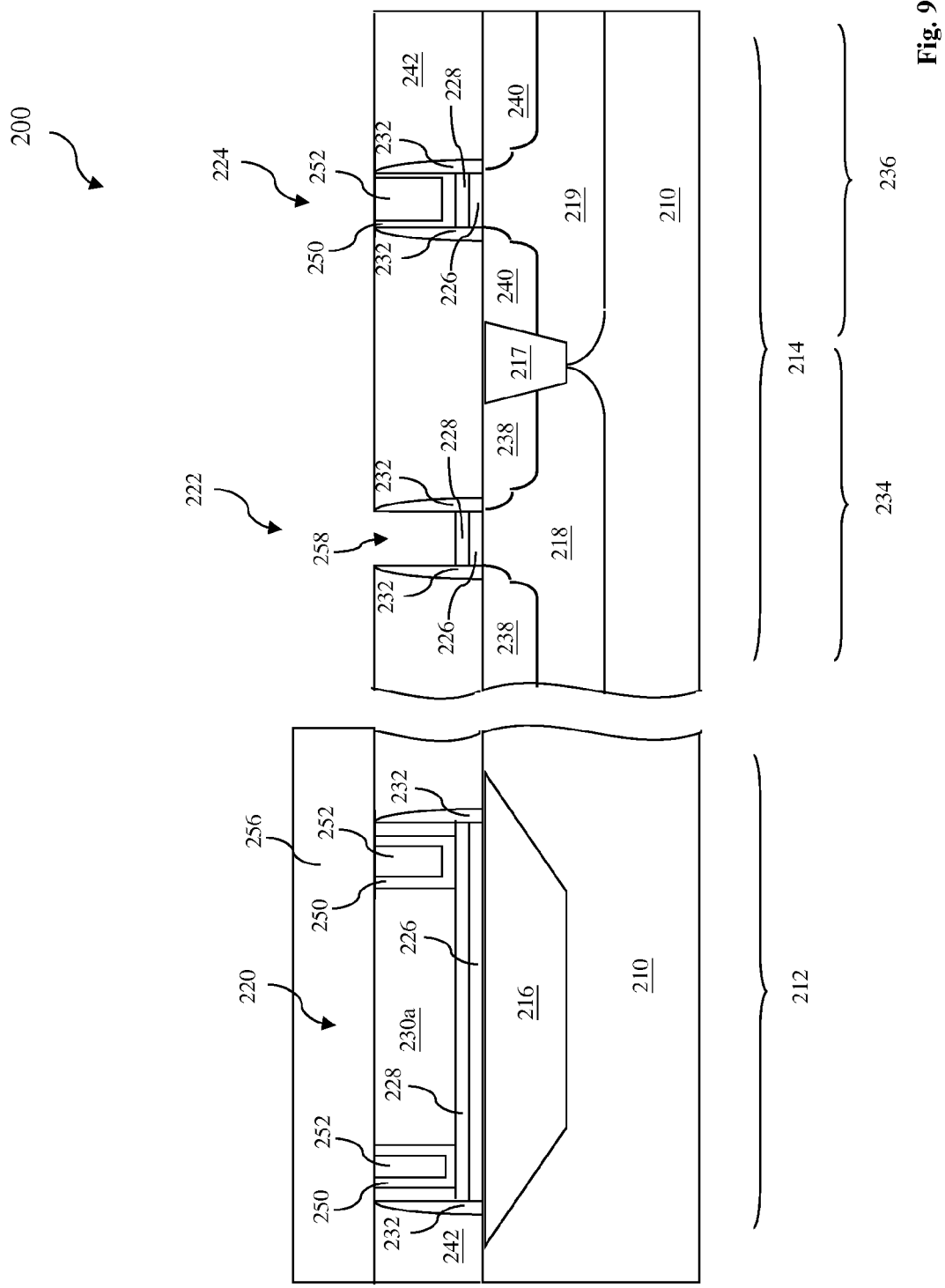

Referring to FIG. 9, the method 100 proceeds to step 118 by selectively removing the polysilicon 230b of the gate stack 222 by an etching process, forming a gate trench 258. Since the selectivity of the etching process to remove the polysilicon, the other conductive materials exposed substantially remain. Furthermore, since the polysilicon material in the polysilicon resistor is protected by the patterned photoresist layer 256, it survives after the etching process. The etching process used to remove the polysilicon may implement suitable dry etching, wet etching or combinations thereof. In one example, an etching solution including HNO3, H2O and HF may be used to remove polysilicon. In another example, chlorine (Cl)-based plasma may be used to selectively remove the polysilicon layer in the gate stack 222.

Figure 10:
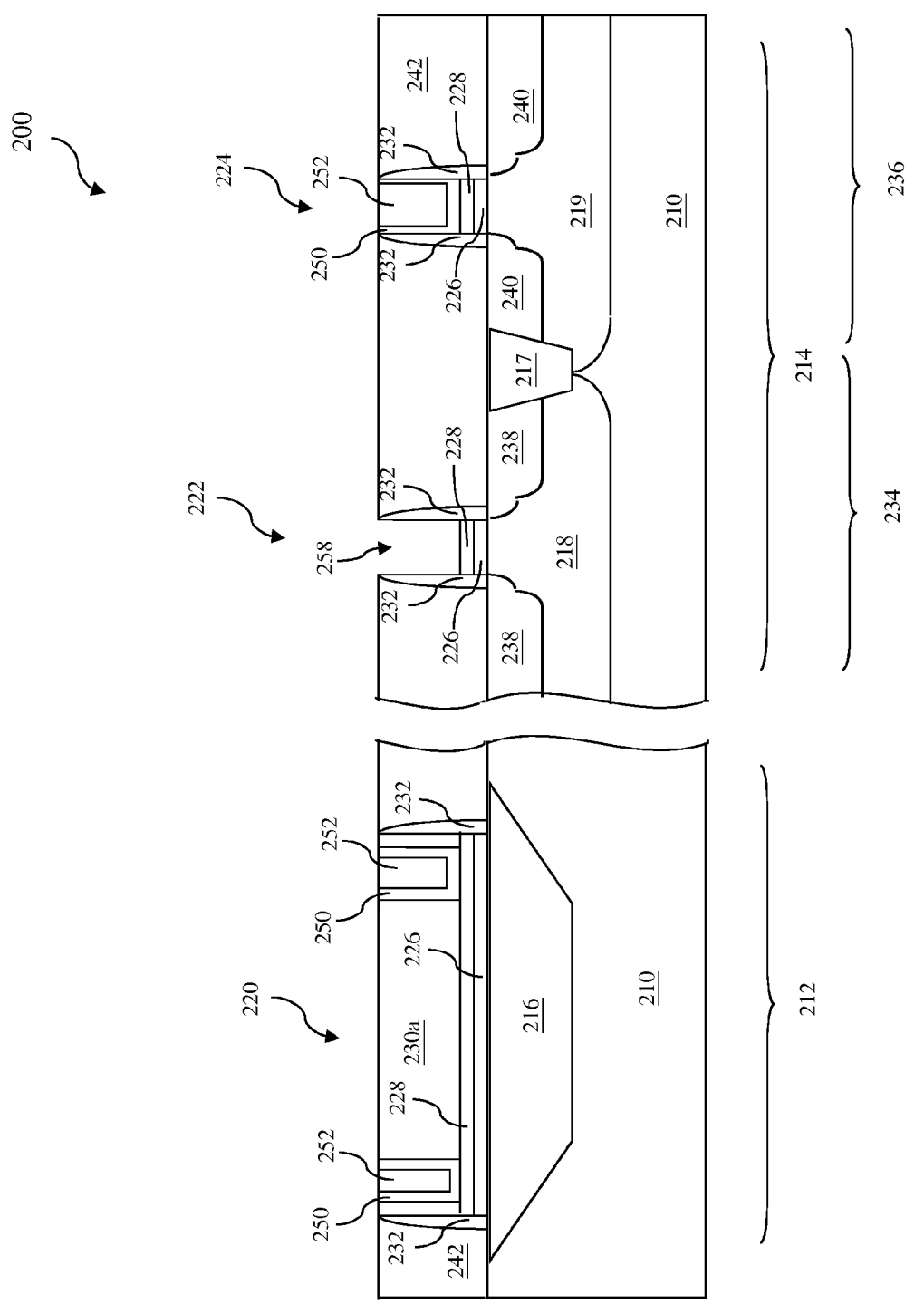

Referring to FIG. 10, the method 100 may proceed to step 120 by removing the patterned photoresist layer 256 using a process, such as wet stripping or plasma ashing, known in the art.

Figure 11:
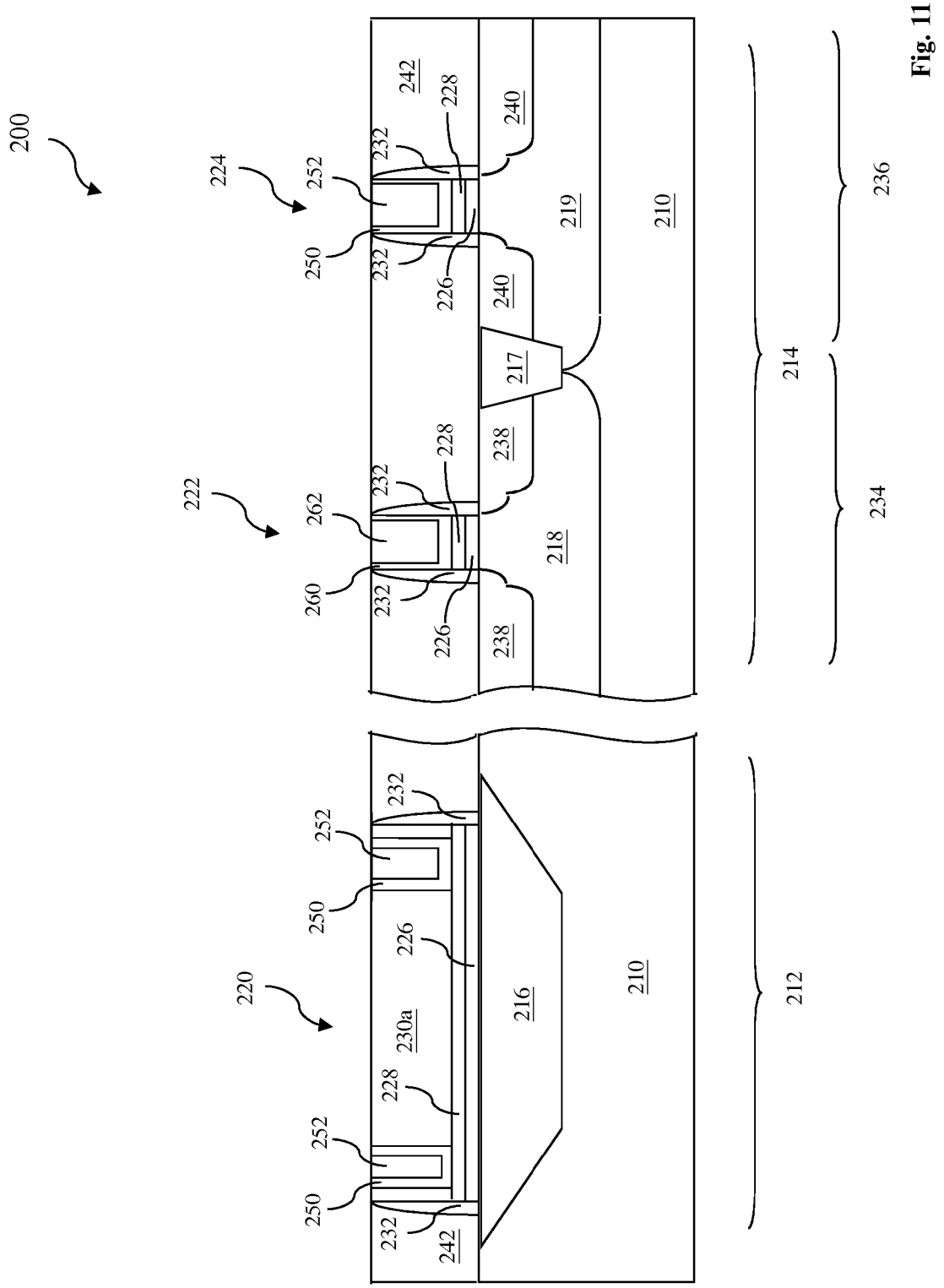

Referring to FIG. 11, the method 100 proceeds to step 122 by filling the gate trench 258 with n-metal 260 and a conductive material 262, forming a gate electrode for the nFET 234. The n-metal includes a metal-based conductive material having a work function compatible to the nFET 234. For one example, the n-metal has a work function of about or less than about 4.2 eV. In one embodiment, the n-metal includes tantalum (Ta). In other embodiments, the n-metal include titanium aluminum (TiAl), titanium aluminum nitride (TiAlN), or combinations thereof. In other embodiments, the n-metal include Ta, TiAl, TiAlN, tungsten nitride (WN), titanium nitride (TiN), tantalum nitride (TaN) or combinations thereof. The n-metal 260 may include various metal-based film as a stack for optimized device performance and processing compatibility. The n-metal layer can be formed by a suitable process, such as PVD. The conductive material 262 is thereafter substantially fills in the gate trench 258. The conductive material 262 includes tungsten or aluminum according to various embodiments. The method to form the conductive material may include CVD or PVD. Additionally, another CMP process may be applied to remove the excessive n-metal and the conductive material above the trenches 258 and on the ILD layer 242.

Figure 12:
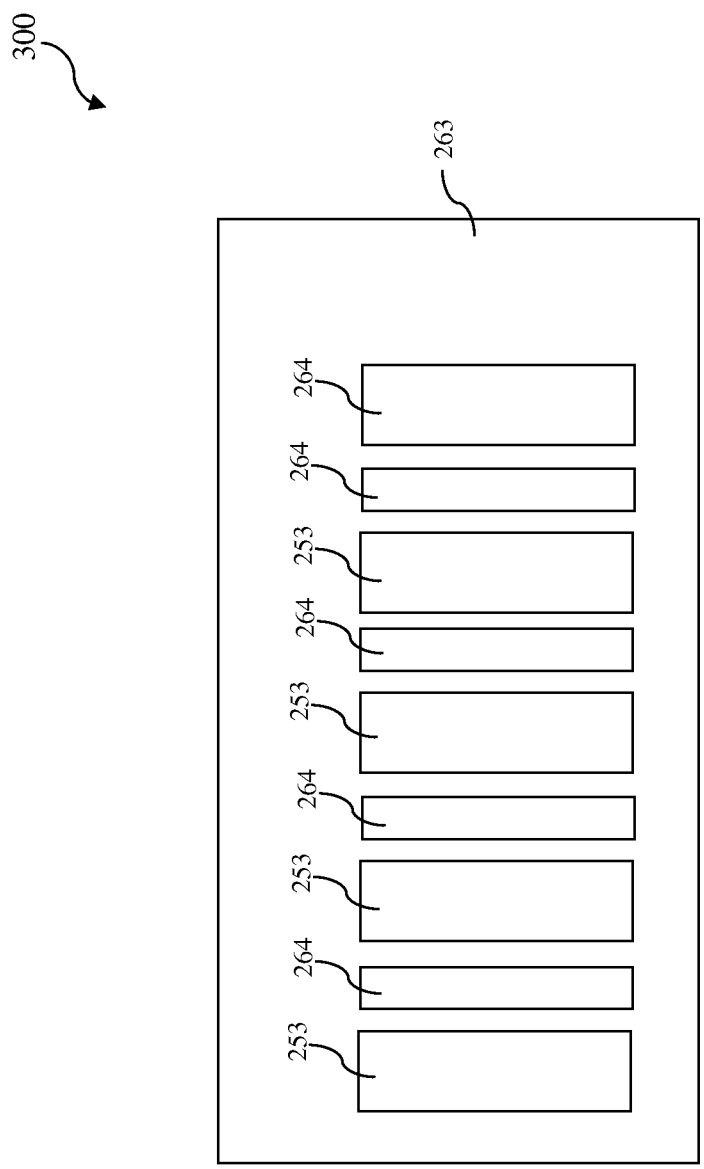
FIG. 12 is a top view of one embodiment of a semiconductor structure having a plurality of polysilicon stacks constructed according to various aspects of the present disclosure.

Although not shown, other alternatives and features may present in the passive device 253 (such as one illustrated FIG. 7) and other processing steps may present to form various features. In one embodiment, the passive device 253 can be properly configured and alternatively used as a polysilicon fuse for proper applications. In another embodiment, the passive device 253 is configured as an array, each being disposed on the shallow trench isolation (STI) 263 and adjacent passive devices being separated by active regions 264, as illustrated in FIG. 12 as a top view of a semiconductor structure 300 having a plurality of passive polysilicon device 253 constructed according to various aspects of the present disclosure in one or more embodiment. The semiconductor structure 300 is a portion of an integrated circuit having both plurality of passive polysilicon devices 253 and various field effect transistors each with a gate stack of high k dielectric and metal electrode (not shown). The passive polysilicon devices 253 are defined on the STI 263 and interleaved with the active regions 264 to have an uniform structure and optimized device performance. The active region 264 can be dummy active region incorporated into the plurality of passive polysilicon devices 253. In one example, one or more dummy polysilicon features may be incorporated into the plurality of passive polysilicon devices 253 to form such an interleaved configuration. According to various embodiments, the passive polysilicon devices 253 include n-type or p-type dopants with a doping concentration tuned to have an intended electric resistance, or alternatively no dopant for a higher resistance. In another embodiment, the electrodes 254 embedded in the passive device 253 (such as those in FIG. 7 and not shown here for simplicity) may have other proper geometries and dimensions. For example, the electrodes 254 may have a square or rectangle shape with proper dimensions such that the electric current can uniformly flow and/or the resistance is defined in an optimized mode.

In another embodiment, the p-metal layer 250 and n-metal layer 260 are formed in different order such that n-metal layer 260 is formed first and the p-metal layer 250 is formed thereafter. In another embodiment, the polysilicon feature is formed with the n-metal layer and is therefore incorporated with the n-metal layer. In another embodiment, the pFET 236 has a strained structure for enhanced carrier mobility and improved device performance. In furtherance of the embodiment, silicon germanium (SiGe) is formed in the source and drain regions of the pFET to achieve a proper stress effect at step 104. In one example of forming such a strained pFET, the silicon substrate within the source and drain regions of the pFET 236 are recessed by one or more etching step. Then SiGe is epi grown in the recessed regions and heavy doped source and drain are formed in the epi grown SiGe features. In another example, a dummy spacer is formed after the formation of the LDD features. The dummy spacer is removed after the formation of the SiGe features. Then a main spacer is formed on the sidewalls of the associated gate stack, with a different thickness such that the heavy doped source and drain have an offset from the SiGe features. For instance, the main spacer is thicker than the dummy spacer such that the heavy doped source and drain are well formed in the SiGe features.

In another embodiment, the nFET 234 has a strained structure for enhanced carrier mobility and improved device performance. In furtherance of the embodiment, silicon carbide (SiC) is formed in the source and drain regions of the nFET to achieve a proper stress effect at step 104. The strained nFET can be formed similarly as the strained pFET is formed. In another embodiment, the n-metal and p-metal layers each may include other proper metal or metal alloy. In another embodiment, the n-metal and p-metal layers each have a multi-layer structure to have an optimized work function and reduced threshold voltage. The gate stacks within the first region and polysilicon stacks within the second region formed at step 104 may include other material layers. For example, an interfacial layer (IL), such as silicon oxide, is formed on the silicon substrate before the formation of the high k dielectric layer. The silicon oxide layer can formed on the semiconductor substrate by a thermal oxidation or atomic layer deposition (ALD). The silicon oxide layer can be formed by other suitable methods such as UV-Ozone Oxidation. The interfacial silicon oxide layer may have a thickness less than 10 A. In another example, a capping layer may be interpose between the high k dielectric layer and the n-metal (or p-metal) layer. The capping layer in the nFET may include lanthanum oxide (LaO). The capping layer in the pFET may include aluminum oxide (AlO).

Other processing steps may be implemented before, during and/or after the formation of the passive device 253, the nFET 234, and the pFET 236. For example, the multilayer interconnection are further formed after the step 122. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

In one example, the high k dielectric layer can be formed by a suitable process such as an atomic layer deposition (ALD). Other methods to form the high k dielectric material layer include metal organic chemical vapor deposition (MOCVD), physical vapor deposition (PVD), and molecular beam epitaxy (MBE). In one embodiment, the high k dielectric material includes HfO2. In another embodiment, the high k dielectric material includes Al2O3. Alternatively, the high k dielectric material layer includes metal nitrides, metal silicates or other metal oxides.

In another example, the formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to etch back.

The various patterning process may include forming a patterned photoresist layer formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, thermal lithography, and molecular imprint.

In another embodiment, a hard mask layer may be formed on the gate stack layers before patterning thereof to form gate stacks and polysilicon stacks at step 104. The hard mask layer is then removed at proper subsequent step or steps. In another embodiment, the patterned hard mask layer includes silicon nitride. As one example of forming the patterned silicon nitride hard mask, a silicon nitride layer is deposited on the polysilicon layer by a low pressure chemical vapor deposition (LPCVD) process. The precursor including dichlorosilane (DCS or SiH2Cl2), bis(TertiaryButylAmino)silane (BTBAS or C8H22N2Si) and disilane (DS or Si2H6) is used in the CVD process to form the silicon nitride layer. The silicon nitride layer is further patterned using a photolithography process to form a patterned photoresist layer and an etching process to etch the silicon nitride within the openings of the patterned photoresist layer. Alternatively, other dielectric material may be used as the patterned hard mask. For example, silicon oxynitride may be used as the hard mask.

Figure 13:
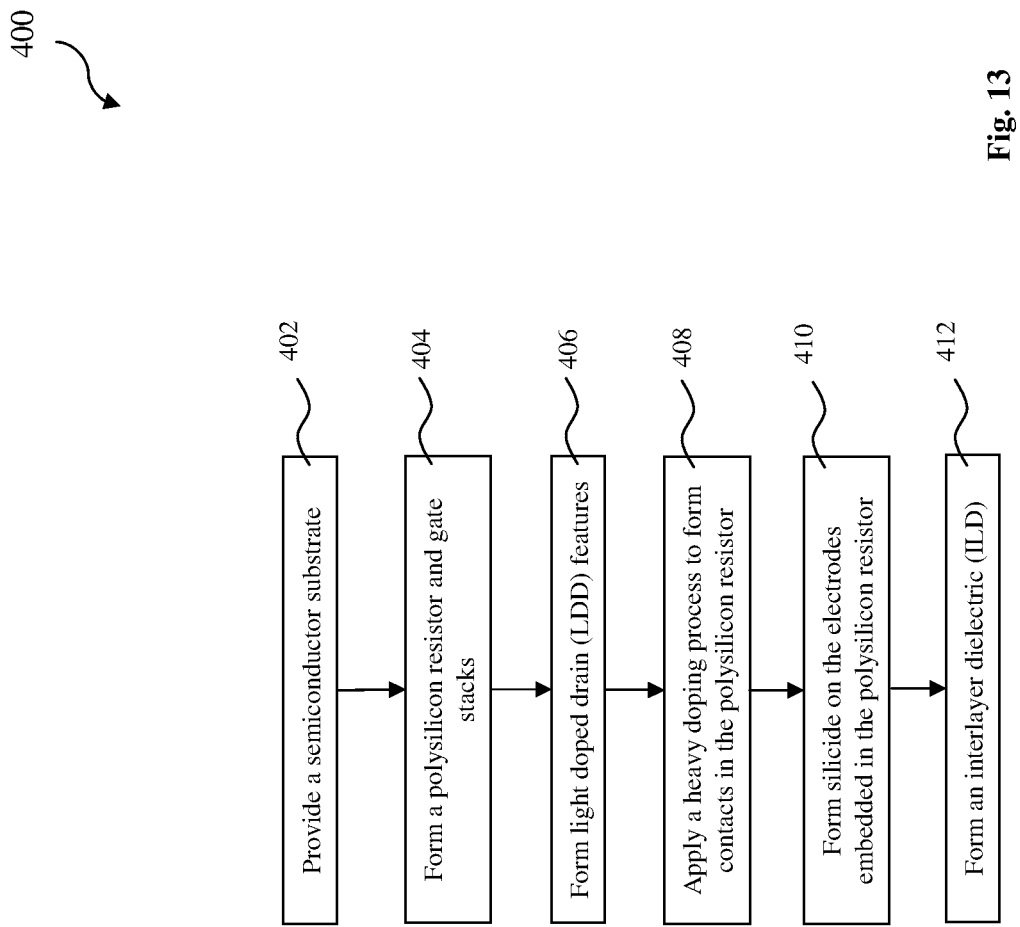
FIG. 13 is a flowchart of a method making a semiconductor device having metal gate stacks and polysilicon structures constructed according to various aspects of the present disclosure.
Figure 14:
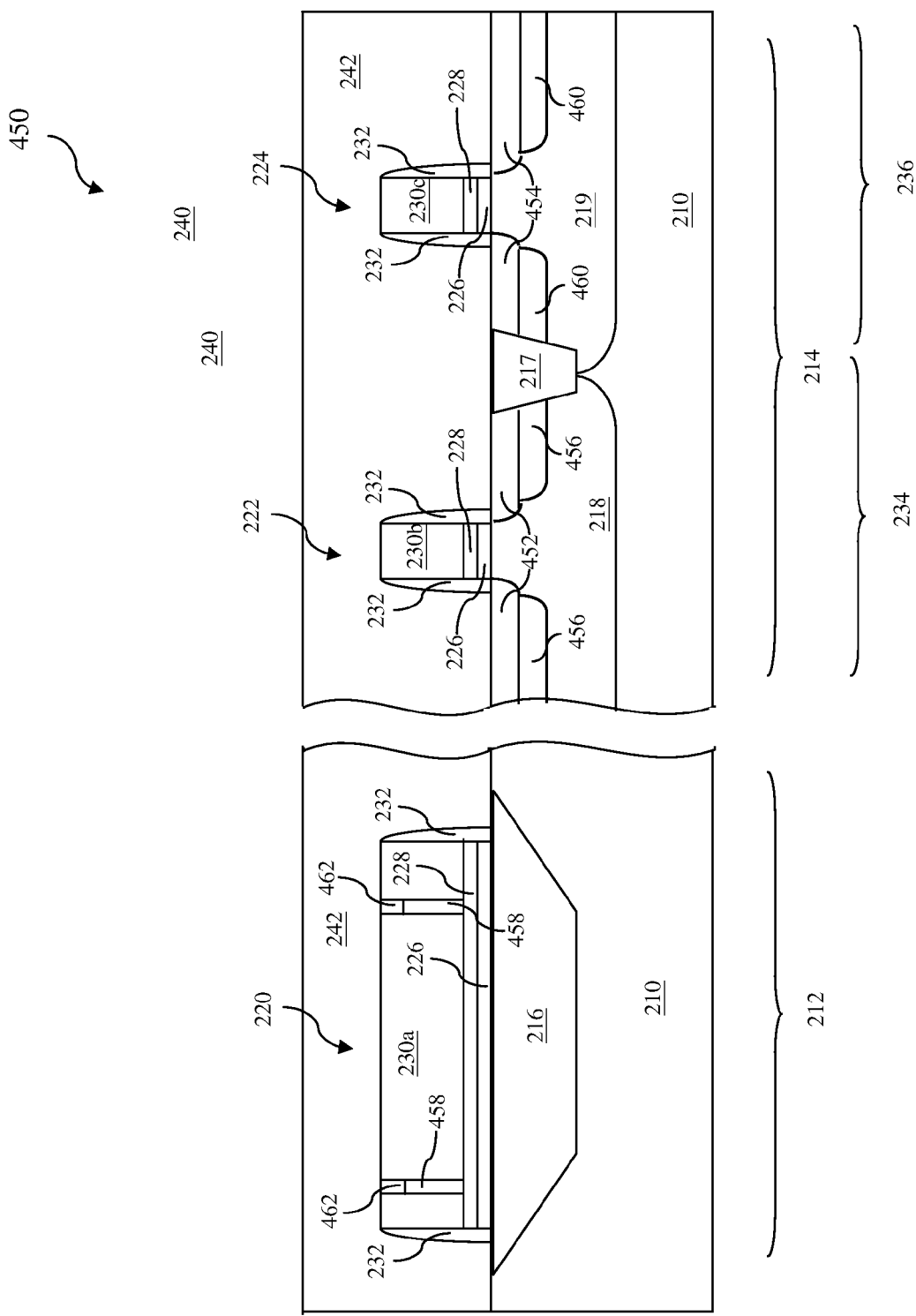
FIG. 14 is sectional view of one embodiment of a semiconductor structure having metal gate stacks and a polysilicon structure constructed according to various aspects of the present disclosure.
Figure 15:
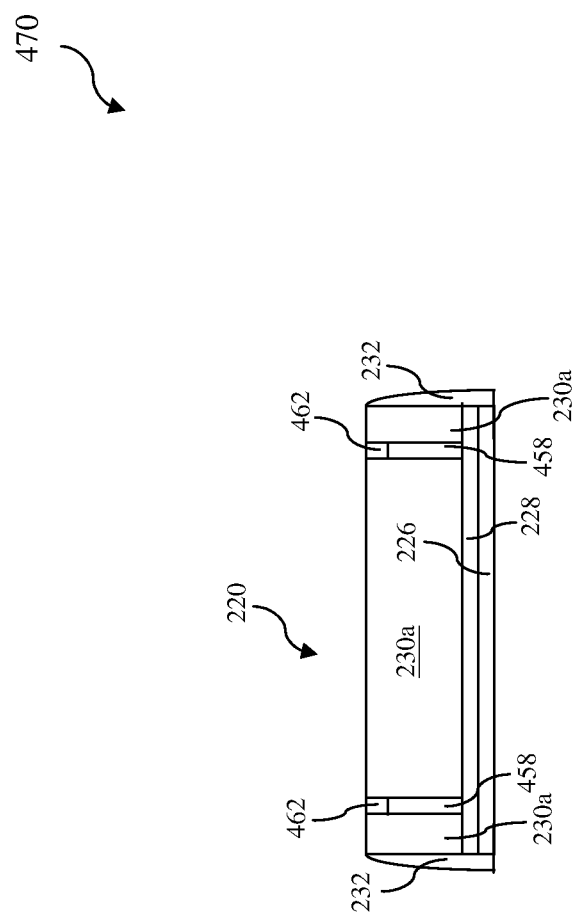

FIG. 13 is a flowchart of another embodiment of a method 400 making a semiconductor structure having a metal gate stack and a passive polysilicon device constructed according to various aspects of the present disclosure. FIG. 14 is a sectional view of the semiconductor structure, referred to as 450. FIGS. 15 and 16 are sectional views of the passive polysilicon device, referred to as 470, constructed according to various embodiments. The semiconductor structure 450 and the method 400 of making the same are collectively described with reference to FIGS. 13 through 16.

The method 400 begins at step 402 by providing a semiconductor substrate 210. The semiconductor substrate 210 is similar to the semiconductor substrate 210 of FIG. 2. The semiconductor substrate 210 includes silicon. Alternatively, the substrate includes germanium, silicon germanium or other proper semiconductor materials. The semiconductor substrate 210 also includes various isolation features such as shallow trench isolation (STI) formed in the substrate to separate various devices. The semiconductor substrate also includes various doped regions such as n-well and p-wells. In one embodiment, the semiconductor substrate 210 includes a first region 212 and a second region 214. The first region 212 includes a trench isolation feature 216 and the second region 214 includes another trench isolation feature 217. The formation of the STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure. In another embodiment, the semiconductor substrate 210 in the second region 214 includes a p-well 218 and an n-well 219.

The method 400 proceeds to step 404 by forming a polysilicon resistor stack 220 in the first region 212 and gate stacks 222/224 in the second region 214. The polysilicon resistor stack (or resistor stack) 220 and the gate stacks 222/224 are formed in the same processing procedure. The resistor stack 220 includes a high-k (high dielectric constant) dielectric layer 226 formed on the STI feature 216. The high-k dielectric layer 226 includes a dielectric material having the dielectric constant higher than that of thermal silicon oxide, about 3.9. In one example, the high-k dielectric layer 226 includes hafnium oxide (HfO). In various examples, the high-k dielectric layer 226 includes metal oxide, metal nitride, or combinations thereof. In one example, the high-k dielectric layer 226 includes a thickness ranging between about 10 angstrom and about 20 angstrom. In one embodiment, the polysilicon resistor stack 220 further includes a conductive layer 228 disposed on the high-k dielectric layer 226. In one example, the conductive layer 228 includes titanium nitride (TiN). In another example, the thickness of the titanium nitride layer ranges between about 10 angstrom and about 30 angstrom.

The resistor stack 220 further includes a polysilicon layer 230 disposed on the conductive layer 228. The polysilicon layer is non-doped to have a lower resistance or lightly doped to have a proper resistance according to the design. Similarly, the gate stacks 222/224 also include the high k dielectric layer 226 disposed on the substrate 210 in the second region 214. In one embodiment, the gate stacks 222/224 also include the conductive layer 228 disposed on the high-k dielectric layer 226. The gate stacks 222/224 also include the polysilicon layer 230 disposed on the conductive layer 228. In one embodiment to form the resistor stack 220 and the gate stacks 222/224, the high k dielectric layer 226 is first disposed on the semiconductor substrate 210. The conductive layer 228 is disposed on the high k dielectric layer 226. The polysilicon layer 230 is deposited on the conductive layer 228. Then, a lithography process and an etching process are applied to the above material layers to pattern thereof, forming the polysilicon resistor stack 220 in the first region 212 and the gate stacks 222/224 in the second region 214. In another embodiment, the patterning process may employ a hard mask. In this case, a hard mask material is formed on the polysilicon layer 230. Then a lithography process and an etch process are used to pattern the hard mask layer, forming various openings. Thereafter, an etch process is applied to the various material layers, including the polysilicon layer 230, the conductive layer 228 and the high k layer 226, through the openings of the patterned hard mask to form the polysilicon resistor stack 220 and the gate stacks 222/224. The polysilicon layer includes various polysilicon features in the resistor stack 220, and the gate stacks 222/224. These polysilicon features, as illustrated in FIG. 14, are referred to as 230a, 230b and 230c, respectively, and are collectively referred to as 230.

In one embodiment, the resistor stack 220 is formed for a passive polysilicon device that can be used as a resistor or a fuse. The first gate stack 222 is formed in the second region 214 for an n-type field-effect transistor (nFET) 234 and the second gate stack 224 is formed in the second region for a p-type field-effect transistor (pFET) 236. In one embodiment, the nFET 234 is formed in the p-well 218. In another embodiment, the pFET 236 is formed in the n-well 219. The nFET 234 further includes various doped regions, such as source/drain 238. Similarly, the pFET 236 further includes various doped regions, such as source/drain 240. In one embodiment, the nFET and pFET include metal-oxide-semiconductor FETs (MOSFET) such as nMOSFET and pMOSFET.

Alternatively, an interfacial layer (IL), such as silicon oxide, may be interposed between the high-k dielectric layer 226 and the substrate 210. Particularly, the interfacial layer is interposed between the STI feature 216 and the high-k dielectric layer 226 in the first region 212 and is interposed between the substrate 210 and the high-k dielectric layer 226 in the second region.

The method 400 may proceed to step 406 by performing a light doping process to form light doped drain (LDD) features 452 in the nFET 234. The doping process can be an ion implantation process using n-type dopant, such as phosphorus. A second doping process is also implemented to form LLD features 454 for the pFET 236. The second doping process can also be an ion implantation process using p-type dopant, such as boron. In one embodiment, spacers 232 are disposed on the sidewalls of the resistor stack 220 and the sidewalls of the gate stacks 222/224 by a process including dielectric deposition and etching, known in the art.

The method 400 proceeds to step 408 by applying a heavy doping process to form electrodes embedded in the resistor stack 220. An ion implantation process is applied to form heavily doped features 458 in the contact regions of the polysilicon resistor. If the hard mask is used to form the resistor stack 220 and the gate stacks 222/224, then the hard mask is removed prior to applying the heavy doping process. The thus formed heavily doped features 458 in the resistor stack function as electrodes and are configured for applying electrical voltage to the passive device during applications. In one embodiment, the electrodes 458 may be defined as two sets. The first set of electrodes is formed at one end of the polysilicon feature 230a of the passive device and the second set is formed at the another end of the polysilicon feature 230a of the passive device, similar to the configuration illustrated in FIG. 7 as a top view of the passive device 253 except for that the metal electrode 254 are replaced by the heavily doped polysilicon electrodes 458. Thus formed passive device having the polysilicon resistor stack and the heavily doped polysilicon electrode embedded in the polysilicon resistor stack electrodes. This passive device can be used as a polysilicon resistor or polysilicon fuse according to various embodiments. In one embodiment, the ion implantation process to form the electrodes 458 may implement a implantation dose ranging between about $1 \times 10^{15}$ and $7 \times 10^{15}/cm^2$. In another embodiment, an annealing process, such as rapid thermal annealing (RTA), may be performed thereafter to drive the doped species deeper. The dopant used to form the electrodes 458 can be either n-type (such as phosphorus) or p-type (such as boron) according to various embodiments.

In one embodiment, the source and drain 456 are formed for the nFET 234 along with the electrodes 458 in the same process. In this case, the electrodes 458 include n-type dopant. Therefore, no further manufacturing cost is added to the semiconductor structure 450. For example, a same photomask is used to define various regions including contact regions of the passive device and S/D regions of the nFET 234. The pattern defined in the photomask is transferred to a photoresist layer or a hard mask. The doping process is then applied to the polysilicon layer 230 through the openings of the photoresist layer or the hard mask layer to form electrodes in the contact regions of the passive device and S/D in the S/D regions of the nFET. In another embodiment, if the polysilicon gates, such as gate stack 222, remain in the final product, then the polysilicon gates may also be heavily doped to enhance the conductivity. In this example, the photomask may further includes openings associated with the polysilicon gates 222. Similarly, source and drain 460 are formed for the pFET 236 by a similar technique using p-type dopant. In an alternative embodiment, the electrodes 458 of the passive device are simultaneously formed with the heavily doped source/drain 460 of the pFET 236 in the same doping process. In this case, the electrodes 458 includes p-type doping species.

As illustrated in FIG. 14, the LDD features are aligned with the associated gate stack and heavily doped source/drain (S/D) features are aligned with the associated sidewall spacer 232. In furtherance of the embodiment, taking nFET 234 as an example, the LDD features are formed first by ion implantation with a light doping dose. Thereafter, the spacer 232 is formed by dielectric deposition and plasma etching. Then the heavily doped S/D features are formed by ion implantation with a heavy doping dose. The various source and drain features and the sidewall spacer of the pFET 236 can be formed in a similar procedure but with opposite doping type. The sidewall spacer of the resistor stack 220 may be formed in a process to form the spacers of nFET 234 and/or the pFET 236.

The method 400 may proceed to step 410 by forming silicide 462 on the electrodes 458 of the passive device. The silicide 462 formed on the electrodes 458 may further reduce the contact resistance to the passive device. The silicide 462 may include nickel silicide. Alternatively, the silicide 462 may other suitable silicide, such as cobalt silicide, tungsten silicide, tantalum silicide, titanium silicide, platinum silicide, erbium silicide or palladium silicide. The silicide 462 may be formed by silicidation such as self-aligned silicide (Salicide). In this process, a metal is deposited on silicon or polysilicon. The temperature of the metal and silicon/polysilicon is raised to a higher level during and/or after the metal deposition to enhance reaction between Si and the metal in order to form silicide. The unreacted metal is then removed by a process such as etching. The annealing process may be one step or multi-step annealing depending on metal material and other conditions. For example, after the removal of the unreacted metal, a second annealing with a temperature higher than that of the first annealing may be applied to the silicide to turn the silicide into a different phase having a lower resistance. In one embodiment, the step 410 to form the silicide 462 may be implemented right after the heavy doping process of the step 409. In furtherance of this embodiment, when the electrodes 458 of the passive device are formed with the heavily doped source and drain 456 of the nFET 234 in the one process, then the silicide is formed on both the source and drain regions of the nFET 234 and the electrodes 458 of the passive device. The source/drain silicide are not shown in FIG. 14 for simplicity.

As one example, the same hard mask used to form the electrodes 458 and the source and drain 456 can be used during the formation of the silicide such that the silicide can be formed on the electrodes but not on other regions of the resistor stack 220. Alternatively, when the electrodes 458 of the passive device are formed with the heavily doped source and drain 460 of the pFET 236 in the one process, then the silicide is formed on both the source and drain regions of the pFET 236 and the electrodes 458 of the passive device. The passive device is further illustrated in FIGS. 15 and 16 constructed according to various embodiments. The Passive device 470 includes the polysilicon feature 230a and heavily doped polysilicon electrode 458 embedded in the polysilicon feature 230a. In one embodiment, the passive device 470 additionally includes the high k dielectric layer 226 underlying the polysilicon feature 130a. In another embodiment, the passive device 470 further includes the conductive layer 228 interposed between the high k dielectric layer 226 and the polysilicon feature 130a. and In one example illustrated in FIG. 15, the electrodes includes both the heavily doped polysilicon 458 and the silicide 462. The electrodes are configured approximately at the two ends of the polysilicon resistor.

In another example illustrated in FIG. 16, the electrodes includes both the heavily doped polysilicon 458 and the silicide 462. The electrodes are configured at the two ends of the polysilicon resistor and substantially aligned with the edges of the polysilicon feature 230a of the passive device. In another embodiment, the passive device further includes spacers 232 formed on the sidewalls of resistor stack 220. In some embodiments, the passive polysilicon device 470 thus configured and formed, as illustrated in FIGS. 13-16, can present one or more advantages described below. The passive polysilicon device has a higher resistance (for no-doped polysilicon feature 230a of the passive device) or a properly controlled resistance (for lightly doped polysilicon feature 230a of the passive device). The contact resistance is substantially reduced and an ohm contact is formed due to the heavily doped polysilicon electrodes and/or silicide formed on the top portion of the electrodes. There is no additional manufacturing cost since no additional processing steps. The heavy doping process to form the electrodes can be implemented with the heavy doping process to form the source/drain of the nFET or the pFET according to various embodiments. In this example, only the layout pattern defined on the photomask, used for the nFET (or the pFET) source/drain heavy doping, needs to be modified to include the openings for the electrodes of the passive device.

The method 400 further proceeds to step 412 by forming an interlayer dielectric (ILD) 242 on the semiconductor substrate 210, substantially covering the polysilicon passive device and the nFET and pFET. Then a chemical mechanical polishing (CMP) process may be applied thereafter to polarize the surface of the ILD 242. Other processing steps may be implemented to form the functional circuit.

In one embodiment where the polysilicon gate stacks remain in the final device, the corresponding process is referred to as a gate-first process and the thus formed circuit is referred to as a gate-first scheme. In the gate-first process, the method 400 proceeds to form interconnect structures coupled to the passive polysilicon device, nFET and pFET. For example, contacts, multilayer metal lines and vias may be formed on the substrate to provide proper electrical connection.

In another embodiment where the polysilicon gate stacks are used as dummy gates and are replaced by proper metal gates, the corresponding process is referred to as a gate-last process and the thus formed circuit is referred to as a gate-last scheme. In the gate-last process, the method 400 proceeds to replace the polysilicon gate stacks using metal materials. In one example, the polysilicon in the gate stacks of the nFET and pFET are removed to form a first gate trench in the nFET and a second gate trench in the pFET. Thereafter, a first metal with a first work function is formed in the first gate trench and is further filled with a conductive material to form a metal gate for the nFET. A second metal with a second work function is formed in the second gate trench and is further filled with a conductive material to form a metal gate for the pFET. For example, the first work function substantially equals to about 4.2 eV and the second work function substantially equals to about 5.2 eV. Then, formed on the semiconductor substrate are various interconnection structures, including contacts, multilayer metal lines and vias. In another example to form metal gates for the nFET and pFET, and the interconnection, the process is substantially similar to the processing steps 108 through 122 of FIG. 1 except for that the passive polysilicon device remains without change through the processing steps nFET and pFET. For example, at step 112 of FIG. 1, the polysilicon is removed only from the pFET but not from the polysilicon resistor stack 220. The heavily doped polysilicon electrodes remain in the final passive polysilicon device.

Figure 7:
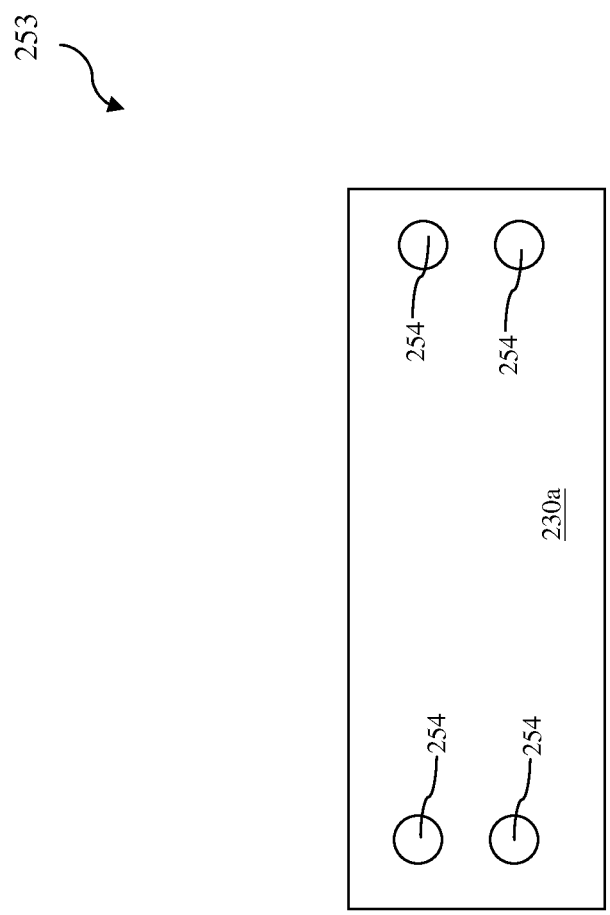
FIG. 7 is a top view of one embodiment of a polysilicon feature and electrodes embedded in the polysilicon feature constructed according to various aspects of the present disclosure.

The semiconductor structures in various embodiments and the methods of making the same may be used in other integrated circuit have a passive polysilicon device 253 of FIG. 7 or a passive polysilicon device 470 of FIG. 15 or 16. The passive device 253 includes metal electrodes embedded therein. The passive device 470 includes doped polysilicon electrodes embedded therein. For example, the passive device (253 or 470) can be used in an integrated circuit having a high k dielectric layer and metal electrode, such as strained semiconductor substrate, a hetero-semiconductor device or a stress-free isolation structure. Other processing steps, alternative steps or materials may present in other embodiments. For example, in the gate-first process to form the heavily doped electrodes, the polysilicon gates may also be heavily doped in the same process to reduce the resistance of the gate electrodes. Either a hard mask or a patterned resist layer may be used in the heavily doping process to form the heavily doped electrodes and source/drain. A light doping process may be used to dope the polysilicon feature 230a to tune the resistance and may be combined with other processing step, such as n-type LDD or p-type LDD, such that the both are formed simultaneously in one procedure.

The present disclosure is not limited to applications in which the semiconductor structure includes a FET (e.g. MOS transistor) and a polysilicon resistor (or polysilicon fuse), and may be extended to other integrated circuit having a metal gate stack. For example, the semiconductor structures may include a dynamic random access memory (DRAM) cell, a single electron transistor (SET), field programmable gate-array (FPGA) and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. The semiconductor substrate also includes dummy gate stacks for n-type field effect transistors (nFETs) and p-type FET (pFETs). In one embodiment, the nFETs and pFETs include metal-oxide-semiconductor (MOS) FETS such as nMOSFETs and pMOSFETs. Particularly, the nFETs include and pFETs include dummy gate stacks having high k dielectric material and polysilicon material.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
   a semiconductor substrate; and
   a passive polysilicon device disposed over the semiconductor substrate, the passive polysilicon device including:
      a conductive layer formed over the semiconductor substrate and formed of a conductive material;
      a polysilicon feature formed on the conductive layer and formed of a polysilicon material, the polysilicon material being different than the conductive material;
      a sidewall spacer disposed along a sidewall of the polysilicon feature and a sidewall of the conductive layer; and
      a plurality of electrodes embedded in the polysilicon feature, wherein a portion of the polysilicon feature extends from an edge of one of the plurality of electrodes to the sidewall spacer, wherein the edge faces the sidewall spacer.

2. The integrated circuit of claim 1, further comprising a high k dielectric layer interposed between the semiconductor substrate and the passive polysilicon device.

3. The integrated circuit of claim 1, wherein the plurality of electrodes include heavily doped polysilicon and the polysilicon feature includes one of non-doped polysilicon and lightly doped polysilicon.

4. The integrated circuit of claim 3, wherein the plurality of electrodes further include silicide disposed on the heavily doped polysilicon.

5. The integrated circuit of claim 1, wherein the plurality of electrodes comprises:
   a first subset of the electrodes configured to be applicable for a first electric potential; and
   a second subset of the electrodes configured to be applicable for a second electric potential.

6. The integrated circuit of claim 1, wherein the passive polysilicon device comprises at least one of a polysilicon resistor and a polysilicon fuse.

7. The integrated circuit of claim 1, wherein the passive polysilicon device is disposed over a shallow trench isolation (STI) disposed in the semiconductor substrate.

8. An integrated circuit, comprising:
   a semiconductor substrate;
   a passive polysilicon device disposed over the semiconductor substrate, the passive polysilicon device including:
      a polysilicon feature;
      a sidewall spacer disposed along a sidewall of the polysilicon feature; and
      a plurality of electrodes embedded in the polysilicon feature, wherein one of the plurality of electrodes has an edge facing the sidewall spacer, and wherein a portion of the polysilicon feature continuously extends from the edge of the one of the plurality of electrodes to the sidewall spacer;
   a first gate stack of a n-type field-effect transistor (nFET) formed on the semiconductor substrate, the first gate stack including:
      a first portion of a high k dielectric layer;
      a first metal layer having a first work function on the first portion of the high k dielectric layer; and
      a first conductive layer on the first metal layer; and
   a second gate stack of a p-type FET (pFET), the second gate stack including:
      a second portion of the high k dielectric layer;
      a second metal layer having a second work function on the second portion of the high k dielectric layer; and
      a second conductive layer on the second metal layer,
   wherein the second work function is greater than the first work function.

9. The integrated circuit of claim 8, wherein the plurality of electrodes comprises:
   one of the first metal layer and the second metal layer; and
   one of the first conductive layer and the second conductive layer.

10. The integrated circuit of claim 8, wherein the first metal layer include tantalum and the second metal layer includes titanium nitride.

11. The integrated circuit of claim 8, wherein each of the first and second conductive layers each comprises one of aluminum and tungsten.

12. An integrated circuit, comprising:
    a semiconductor substrate; and
    a passive polysilicon device disposed over the semiconductor substrate, the passive polysilicon device including:
       a polysilicon feature;
       a sidewall spacer disposed along a sidewall of the polysilicon feature; and
       a plurality of electrodes fully embedded in the polysilicon feature, wherein at least one of the plurality of electrodes includes a first feature of a first conductive material and a second feature of a second conductive material, the first feature formed on the second feature and the first conductive material being different than the second conductive material, wherein the second feature has an edge facing the sidewall spacer, and wherein a portion of the polysilicon feature continuously extends from the edge of the second feature to the sidewall spacer.

13. The integrated circuit of claim 12, wherein the passive polysilicon device further comprises:
    a conductive layer formed over the semiconductor substrate and formed of a third conductive material,
    wherein the polysilicon feature is formed on the conductive layer and formed of a polysilicon material, the polysilicon material being different than the third conductive material.

14. The integrated circuit of claim 13, wherein the passive polysilicon device further comprises a high k dielectric layer interposed between the semiconductor substrate and the conductive layer.

15. The integrated circuit of claim 12, further comprising
    a high k dielectric layer interposed between the semiconductor substrate and the passive polysilicon device;
    a first gate stack of a n-type field-effect transistor (nFET) formed on the semiconductor substrate, the first gate stack including:
       a first portion of the high k dielectric layer;
       a first metal material having a first work function on the first portion of the high k dielectric layer; and
       a third conductive material on the first metal material; and
    a second gate stack of a p-type FET (pFET), the second gate stack including:
       a second portion of the high k dielectric layer;
       a second metal material having a second work function on the second portion of the high k dielectric layer; and
       a fourth conductive material on the second metal material,
    wherein the second work function is greater than the first work function.

16. The integrated circuit of claim 15, wherein the first conductive material is the same as the third conductive material and the second conductive material is the same as the first metal material.

17. The integrated circuit of claim 15, wherein the first conductive material is the same as the fourth conductive material and the second conductive material is the same as the second metal material.

18. The integrated circuit of claim 12, wherein the passive polysilicon device is disposed over a shallow trench isolation (STI) disposed in the semiconductor substrate.

19. The integrated circuit of claim 12, wherein the polysilicon feature has a top surface and opposing bottom surface such that the at least one of the plurality of electrodes extends from the top surface to the bottom surface of the polysilicon feature.

20. The integrated circuit of claim 12, wherein the polysilicon feature is formed of a polysilicon material, the polysilicon material being different than the first conductive material and the second conductive material.

21. The integrated circuit of claim 12, wherein the passive polysilicon device includes a conductive layer formed over the semiconductor substrate, wherein the at least one of the plurality of electrodes physically contacts the conductive layer.

* * * * *